(12) United States Patent
Allen et al.

(10) Patent No.: US 7,752,589 B2
(45) Date of Patent: Jul. 6, 2010

(54) METHOD, APPARATUS, AND COMPUTER PROGRAM PRODUCT FOR DISPLAYING AND MODIFYING THE CRITICAL AREA OF AN INTEGRATED CIRCUIT DESIGN

(75) Inventors: Robert J. Allen, Jericho, VT (US); Sarah C. Braasch, Richmond, VT (US); Matthew T. Guzowski, Essex, VT (US); Jason D. Hibbeler, Williston, VT (US); Daniel N. Maynard, Craftsbury Common, VT (US); Kevin W. McCullen, Essex Junction, VT (US); Evanthia Papadopoulou, White Plains, NY (US); Mervyn Y. Tan, South Burlington, VT (US); Robert F. Walker, St. George, VT (US)

(73) Assignee: International Business Machines Corporation, Armonk, NY (US)

( * ) Notice: Subject to any disclaimer, the term of this patent is extended or adjusted under 35 U.S.C. 154(b) by 628 days.

(21) Appl. No.: 11/620,059

(22) Filed: Jan. 5, 2007

(65) Prior Publication Data
US 2008/0168414 A1 Jul. 10, 2008

(51) Int. Cl.
*G06F 17/50* (2006.01)
(52) U.S. Cl. .................. 716/11; 716/4; 716/8

(58) Field of Classification Search ............ 716/4, 716/8, 11; 703/1; 700/110, 121
See application file for complete search history.

(56) References Cited

U.S. PATENT DOCUMENTS

| 6,178,539 | B1 * | 1/2001 | Papadopoulou et al. | 716/7 |
| 6,247,853 | B1 * | 6/2001 | Papadopoulou et al. | 716/4 |
| 6,317,859 | B1 * | 11/2001 | Papadopoulou | 716/4 |
| 6,918,101 | B1 * | 7/2005 | Satya et al. | 716/5 |
| 6,948,141 | B1 * | 9/2005 | Satya et al. | 716/4 |
| 2005/0240839 | A1 * | 10/2005 | Allen et al. | 714/724 |
| 2006/0150130 | A1 | 7/2006 | Allen et al. | |

OTHER PUBLICATIONS

Papadopoulou et al.,"Critical Area Computation via Voronoi Diagrams", Apr. 1999, IEEE Transaction on Computer-Aided Design of Integrated Circuits and Systems, vol. 18, No. 4, pp. 463-474.*
Papadopoulou,"Critical Area Computation for Missing Material Defects in VLSI Circuits", May 2001, IEEE Transactions on Computer-Aided Design of Integrated Circuits and Systems, vol. 20, No. 5, pp. 583-597.*

* cited by examiner

*Primary Examiner*—Sun J Lin
(74) *Attorney, Agent, or Firm*—Ryan K. Simmons (57) ABSTRACT

A method, apparatus, and computer program product for visually indicating the interaction between one or more edges of a design that contribute to a defined critical area pattern.

32 Claims, 11 Drawing Sheets

METHOD, APPARATUS, AND COMPUTER PROGRAM PRODUCT FOR DISPLAYING AND MODIFYING THE CRITICAL AREA OF AN INTEGRATED CIRCUIT DESIGN

BACKGROUND

1. Technical Field of the Present Invention

The present invention generally relates to semiconductor designs and, more specifically, to the display and modification of the critical area for such designs.

2. Description of Related Art

The ability to accurately predict and improve wafer yields for a particular manufacturing technology has become increasingly important for the semiconductor industry. Yield predictions are used for bidding and capacity determinations, and therefore, directly tied to the profitability of the manufacturing facility. Obviously, the ability to improve yields is highly desirable.

One aspect of yield prediction is determining the susceptibility of a design to random defects that result from particle contaminants introduced from dust, materials and equipment. For the past thirty years, the semiconductor industry has used random defect yield prediction modeling to determine the susceptibility of a design to particle contaminates.

A central concept for random defect modeling is that of critical area which is a quantification of which parts of a semiconductor design are sensitive to specific defect failure mechanisms from particle contaminants. These particle contaminants can produce extra material defects that result in shorts between different conducting regions, and missing material defects that result in open circuits.

The critical area of a design can be used with various random defect yield prediction modeling techniques such as Monte Carlo and shape shifting to determine the sensitivity of the design to defect failures that result from particle contaminates.

Although these techniques provide the designer with information on how susceptible the design is to particle defect failures, they fail to provide any information on how the susceptibility of the design can be improved from the layout shape edges of the design.

It would, therefore, be a distinct advantage to have a method, system, and computer program product that would provide the critical area of a design and information that relates the layout shape edges for defects in a manner that allows the designer to improve the sensitivity of the design to various types of failures.

SUMMARY OF THE PRESENT INVENTION

In one aspect, the present invention is a method of designing integrated circuits. The method includes the step of creating a Voronoi diagram to represent the critical area of a design of an integrated circuit, the Voronoi diagram having one or more bisectors each of which represents an interaction between one or more corresponding edges of the design. The method also includes the step of visually identifying the portion(s) of the one or more corresponding edges and their interaction with one another.

BRIEF DESCRIPTION OF THE DRAWINGS

The present invention will be better understood and its advantages will become more apparent to those skilled in the art by reference to the following drawings, in conjunction with the accompanying specification, in which.

DETAILED DESCRIPTION OF THE PREFERRED EMBODIMENT OF THE PRESENT INVENTION

The present invention is a method, apparatus, and computer program product for visually indicating the interaction between one or more edges of a design that contribute to a defined critical area pattern. More specifically, a Voronoi diagram for the design is created and its bisectors are assigned to the one or more interacting edges. These bisectors are used to create a polygonal region that identifies the portion(s) of the edges that interact with one another. The designer is provided with visual cues that indicate the severity of the interactions according to predetermined criteria.

Types of Faults

Critical area is a quantification of which parts of a semiconductor chip are sensitive to specific defect failure mechanisms and is used to predict the loss of yield of a chip due to random defects as a function of a particular fault mechanism. A fault mechanism is defined as the manner in which a random defect causes a type of fault (an electrical disruption to the operation of the chip) based on a triggering layout edge. A fault is caused from particles of foreign matter that add material or result in missing material such as those described below.

Figure 1:
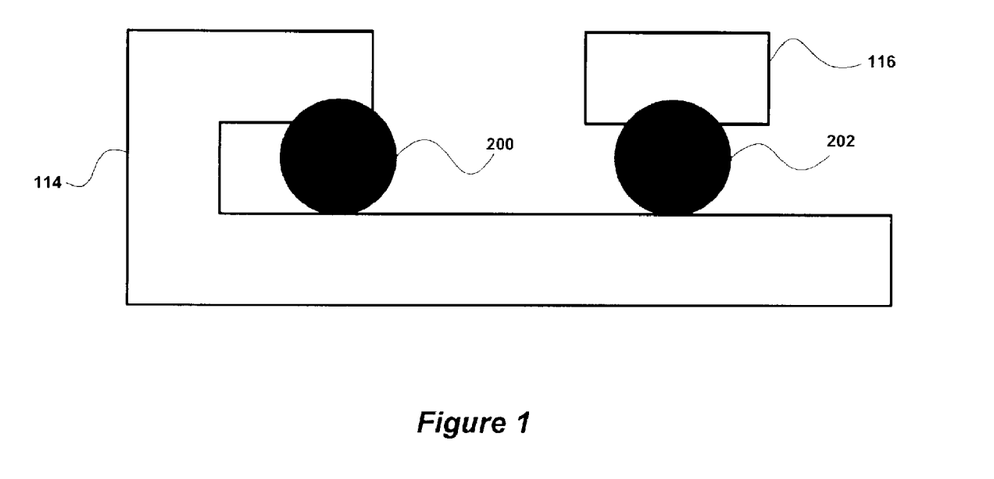
FIG. 1 is a diagram illustrating some particles that add material without causing a fault.

FIG. 1 is a diagram illustrating how particles can touch a net without causing a fault. More specifically, particle 200 touches net 114 and shorts one portion of the net 114 to another, but it does not alter the desired electrical characteristics (i.e., current still flows as expected). Particle 202, however, creates a type of fault referred to as a "short" fault since it touches and couples two different nets 116 and 114 to one another.

Figure 2:
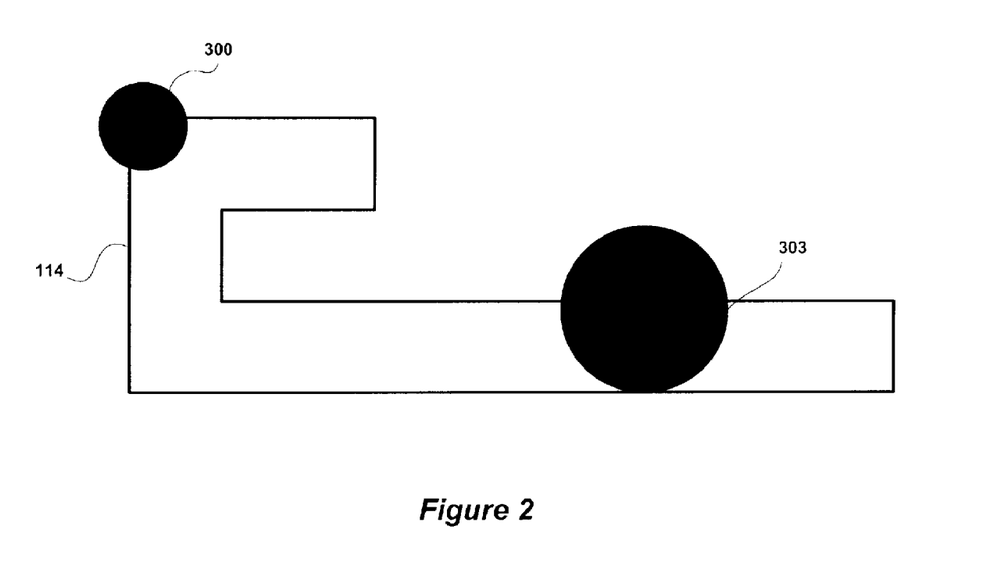
FIG. 2 is a diagram illustrating an open type fault.

Another type of fault referred to as an "open" fault occurs when a foreign particle removes enough material from a desired location so as to cause a complete break in the net as illustrated by FIG. 2. In example, particle 303 removes enough material to completely break net 114. Net 114 is only partially broken by the material removed from particle 300 and so no fault is created.

Figure 3:
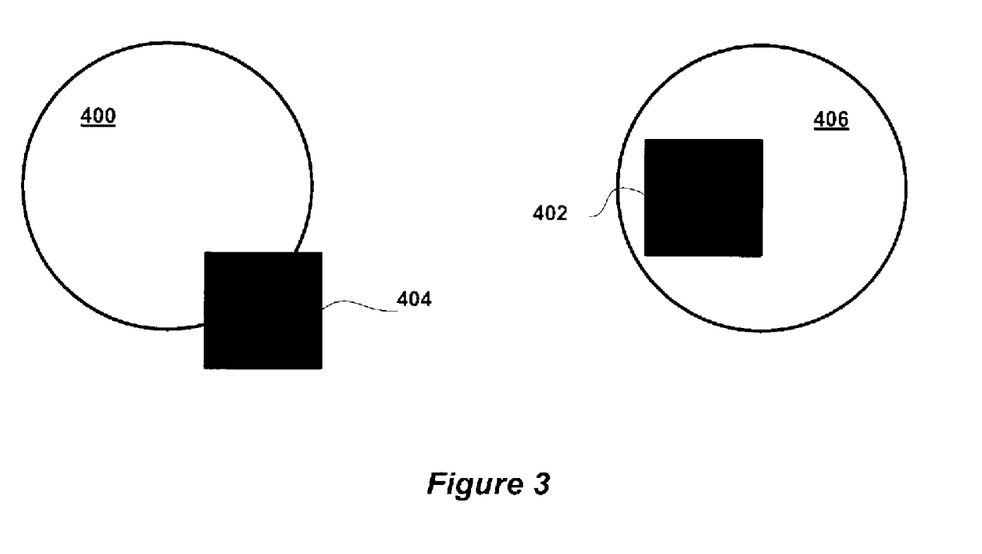
FIG. 3 is a diagram illustrating a via block type fault.

A "via block" fault is created when a particle adds enough material so as to completely block a via or contact as illustrated in FIG. 3. More specifically, via 402 is completely blocked by particle 406 creating a via block while via 404 is only partially blocked by particle 400.

Critical Area Extraction

Critical area is a quantification of which parts of a semiconductor chip are sensitive to specific defect failure mechanisms and is used to predict the loss of yield of a chip due to random defects as a function of a particular fault mechanism.

One such technique for determining critical area is a Voronoi diagram. A Voronoi diagram conceptually takes a set of shapes in a plane and partitions that plane into regions each having the property that all points in that region are associated with the closest shape edge of some particular characteristic.

Based on the circuit design and under an appropriate geometry, Voronoi diagrams can be constructed to model the effect of faults resulting from extra-material and missing-material in a manner that is well known and understood (e.g., see U.S. Pat. Nos. 6,317,859, 6,247,853, and 6,178,539).

Although a Voronoi diagram illustrates the critical area for regions in the layout, it fails to indicate to the designer how to relate the critical area to layout shape edges for the purpose of improving the design. The present invention uses Voronoi diagrams in combination with additional information to inform the designer of this relationship as described below.

Figure 4:
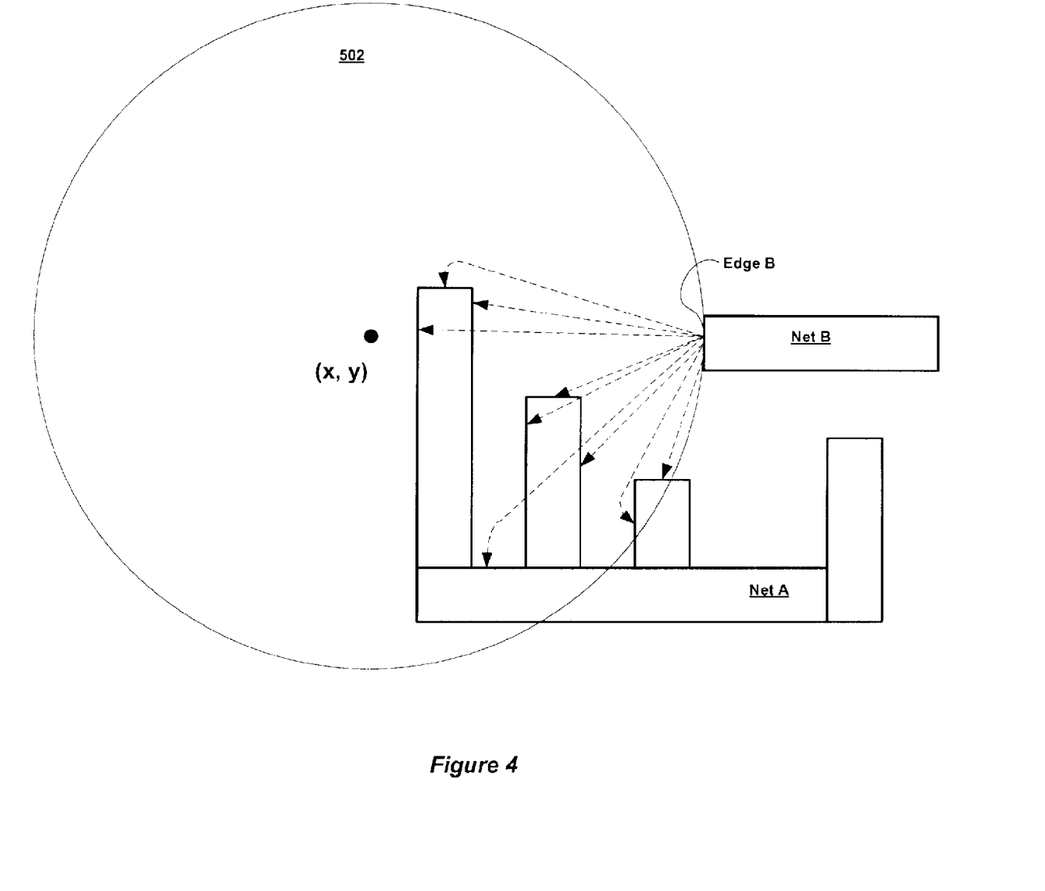
FIG. 4 is a diagram illustrating two nets A and B and the critical area for a point (x,y)

For example, FIG. 4 illustrates two nets A and B and the critical area for point (x,y) as illustrated by circle 502. Each of the edges of net A that interact with edge B of net B are indicated with bi-directional arrows extending from edge B. Now assume that a short results from a fault on point (x,y). Without any further information, the designer is unable to ascertain which of the interacting edges to widen or otherwise alter to improve the critical area.

Figure 5:
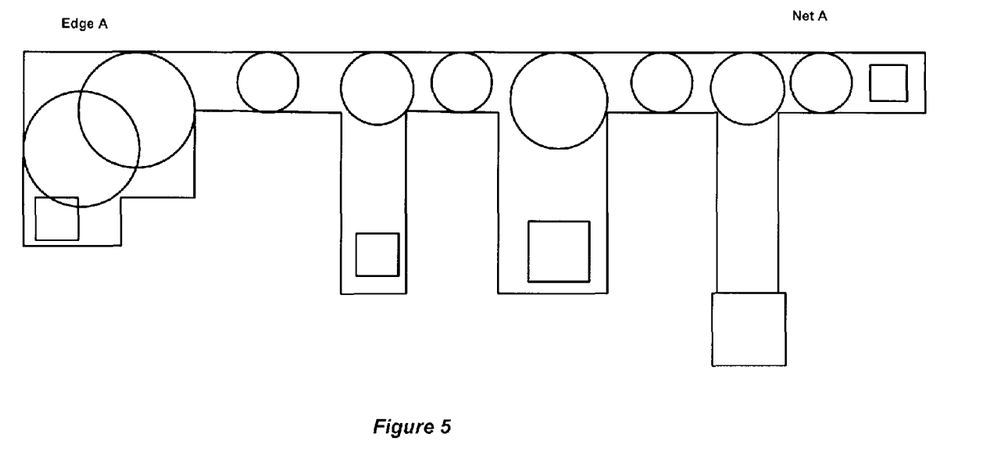
FIG. 5 is a diagram illustrating a single net with opens indicated by circles that can occur between an edge A and multiple interacting edges.

In another example, FIG. 5 illustrates a single net A with opens indicated by circles that can occur between an edge A and multiple interacting edges. Again, without further information, the designer is unable to ascertain what portions of edge A should be moved or otherwise altered to improve critical area.

The present invention provides this additional information by assigning the critical area of a Voronoi region to a subset of its bisectors (hereinafter referred to as "generators") in a prorated manner. Generators are those bisectors from which distance is measured within the Voronoi region. Generators are associated with a pair of interacting shape edges relating to a particular fault type within the design as explained in greater detail in connection with FIGS. 6 and 7 below.

Figure 6:
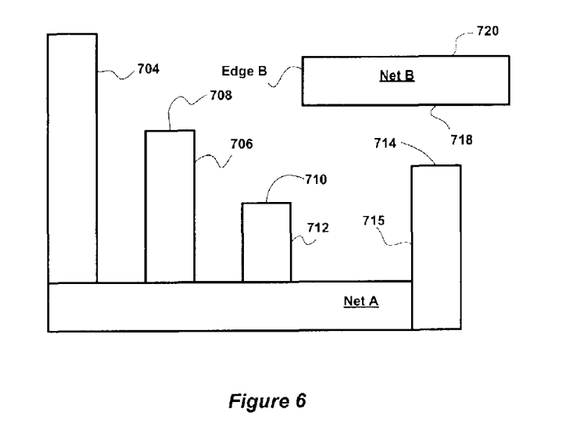
FIG. 6 is a diagram illustrating a design with a pair of nets A and B defined by shapes with edges that can interact with one another.

Reference now being made to FIG. 6, a diagram is shown illustrating a design with a pair of nets A and B defined by shapes with edges that can interact with one another. Net B includes edges 720, 718, and Edge B. Net A includes edges 704 to 715.

Figure 7:
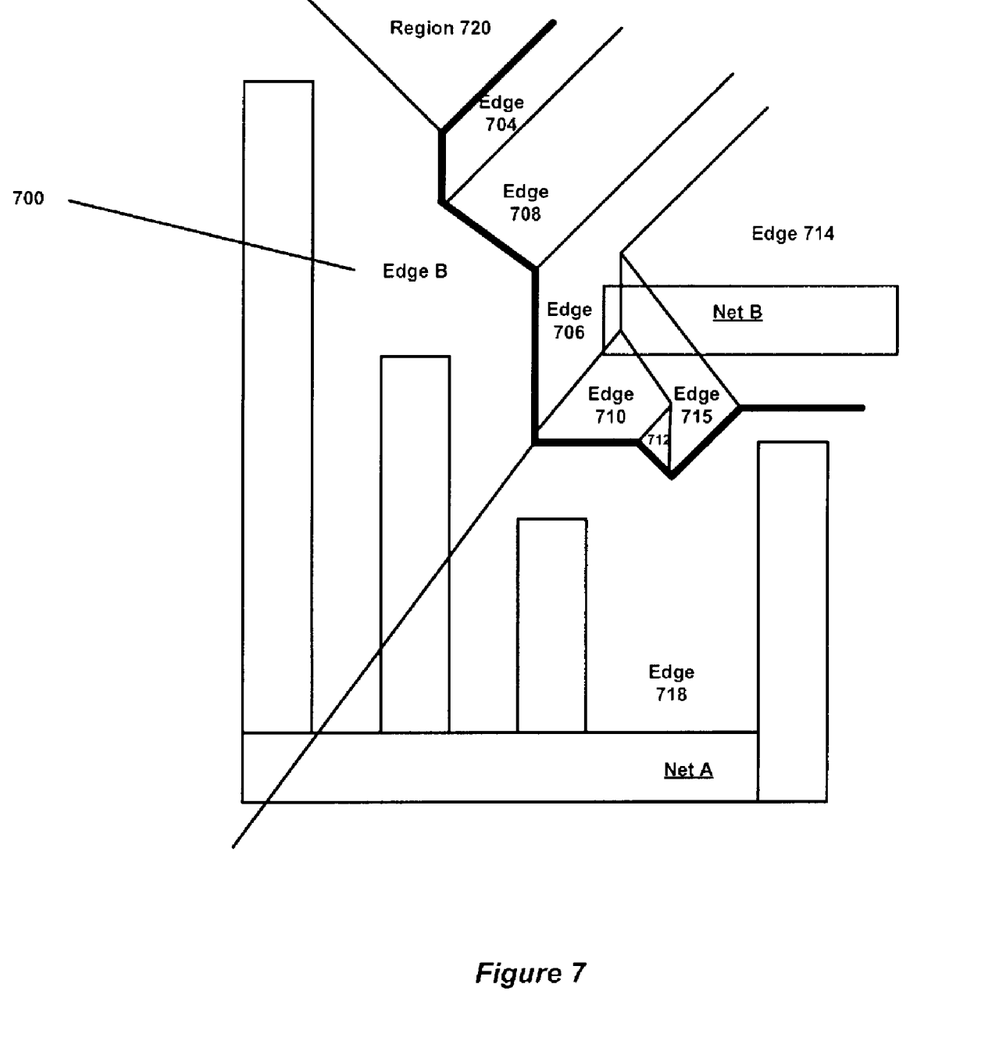
FIG. 7 is a diagram illustrating an example of a Voronoi region for shorts between nets A and B of FIG. 6 according to the teachings of the present invention.

Reference now being made to FIG. 7, a diagram is shown illustrating an example of a Voronoi region 700 for shorts between nets A and B of FIG. 6 according to the teachings of the present invention. Although the example of FIG. 7 is for shorts, it should be understood that the same process and analysis is equally applicable to opens and via blockages. The Voronoi diagram is constructed from the shapes of FIG. 6 using techniques that are well known and understood (e.g., U.S. Pat. Nos. 6,317,859, 6,247,853, and 6,187,539 which are incorporated by reference herein). In this example, the Voronoi region 700 is associated with Edge B and has adjacent Voronoi regions associated with edges 704, 706, 708 and 710 identified as corresponding regions 704-710.

Figure 8:
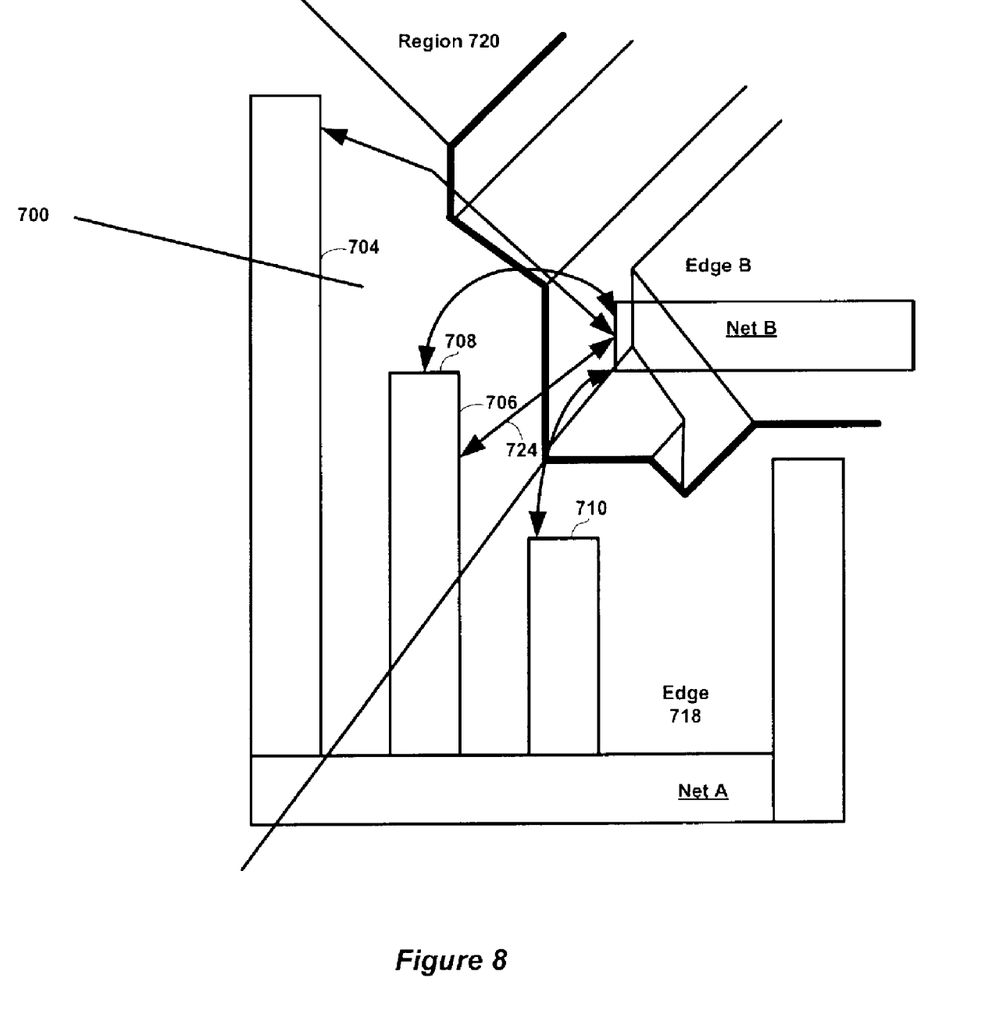
FIG. 8 is a diagram illustrating a portion of the interacting edges on nets A and B according to the teachings of the present invention.

Reference now being made to FIG. 8, a diagram is shown illustrating a portion of the interacting edges on Nets A and B according to the teachings of the present invention. Bi-directional arrows are used to identify the interacting edges on Nets A and B that are involved with Voronoi region 700. For example, bi-directional arrow 724 touches edge 706 of net A and Edge B of net B. The bisectors bounding the Voronoi region 700 that each of the bi-directional arrows pass-thru is identified as a generator.

It is well understood that the critical area of the face is the accumulated critical area contribution of each bisector that bounds the face. The generators, once identified according to the teachings of the present invention, represent a subset of these bisectors. The critical area to which each generator (and thus associated edge interaction) is assigned for the purpose of critical area display is the total critical area of the Voronoi region multiplied by the percent critical area contribution of that generator with respect to the sum of the critical area contributions of all generators around the face. In general, each generator borders two Voronoi regions and the assigned critical area from both regions (as just described) can be summed to produce a final critical area assignment to the generator and associated edge interaction.

Figure 9:
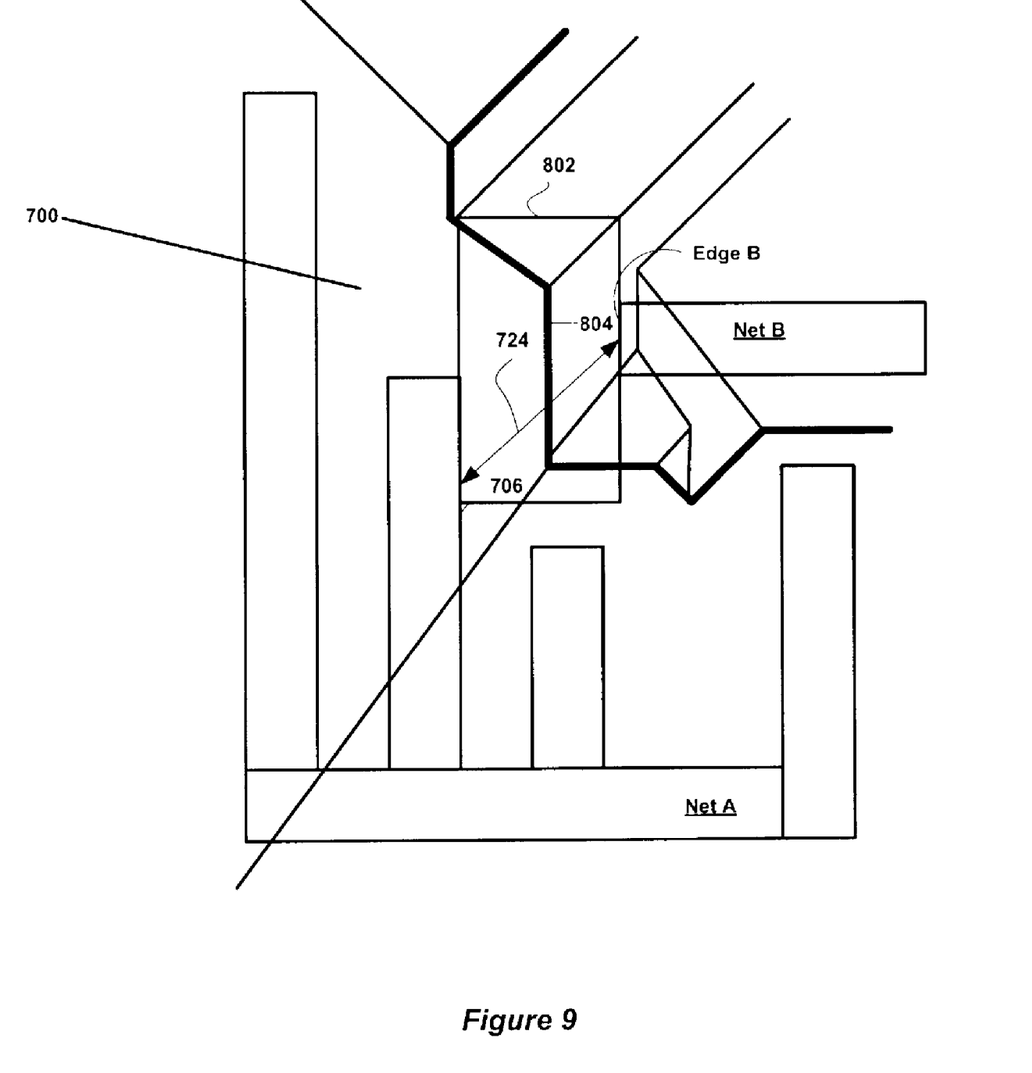
FIG. 9 is a diagram illustrating the example of the Voronoi region of FIG. 8 in greater detail concerning a selected generator according to the teachings of the present invention.

Reference now being made to FIG. 9, a diagram is shown illustrating the example of the Voronoi region 700 of FIG. 8 in greater detail concerning a selected generator 804 according to the teachings of the present invention. In this example, generator 804 formed by the interaction of edge 706 and Edge B as noted with bi-directional arrow 724. According to the teachings of the present invention, generator 804 is assigned a critical area equal to the critical area of Voronoi region 700 multiplied by the critical area contribution of generator 804 and divided by the critical area contribution of all generators bounding Voronoi region 700.

In order to determine the parts of a shape edge in the design that can be modified to improve critical area, a polygonal region 802 is created from an outline of the set of points around the generator 804 contained within the weight of generator 804, the weight of a point being its distance to either interacting edge 706 or Edge B.

The polygonal region is used to identify those portions of the interacting edges that can be modified to improve the associated critical area. More specifically, the portion of the edge(s) touching the polygonal region is the portion that can be modified to have an effect on the critical area associated with the interaction between the edges that created the associated generator. The modification of any part of the edge that is not touching the polygonal region will fail to improve the associated critical area.

In this example, the portion of edge 706 touching the polygonal region 802 can be modified (e.g., by moving it further away) to improve the critical area between edge 706 and Edge B. However, any modification of any portion of edge 706 that is not touching the polygonal region 802 will fail to improve the critical area.

In a preferred embodiment of the present invention, this information is provided to the designer by visual depiction. More specifically, depending upon the severity of the impact of critical area, the designer is provided with a visual depiction indicating the severity level and the interacting edges as illustrated in FIG. 10.

Figure 10:
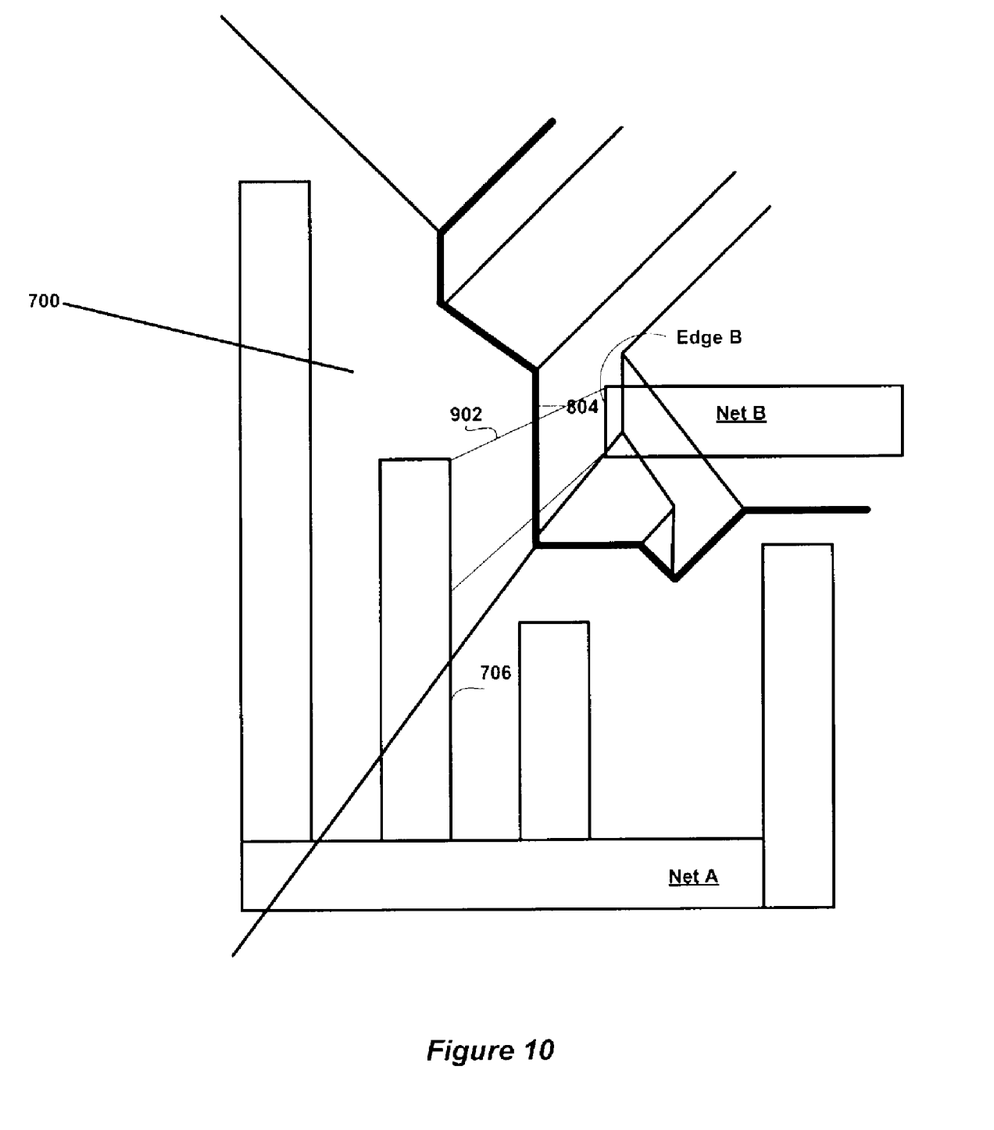
FIG. 10 is a diagram illustrating the Voronoi region of FIG. 9 with visual indications for the interacting edges that produced the generator according to the teachings of the present invention.

Reference now being made to FIG. 10, a diagram is shown illustrating the Voronoi region 700 of FIG. 9 with visual indications for the interacting edges that produced the generator 804 according to the teachings of the present invention. More specifically, a vector 902 can be created between the portion of edge 706 that is interacting with Edge B and color coded according to severity (e.g., red for critical), thus, providing a visual cue.

The total number of edge interactions can number in the millions. Consequently, the preferred embodiment of the present invention allows the designer to identify and display a subset of interactions based on a range of critical area values or a percentage range of critical values, and the ability to filter out those interactions which the designer has marked as being fixed, unfixed, or otherwise to be excluded.

For example, a list of edge interactions, associated polygonal regions, and associated critical area contributions can be maintained. The highest ten percent contributing interactions can then be displayed and colored by the magnitude of the contribution value. This enables the designer to identify the edges that can be modified to yield the greatest improvement. Other specified criteria can also be used.

As a further example, the interactions modified or selected by the designer can be filtered from display by maintaining polygonal markers that touch or cover those interactions or groups of interactions to be filtered. These polygonal markers can persist through subsequent re-computations of critical area after modification has been made and used to identify the interactions that were previously designated to be filtered from display.

Figure 11:
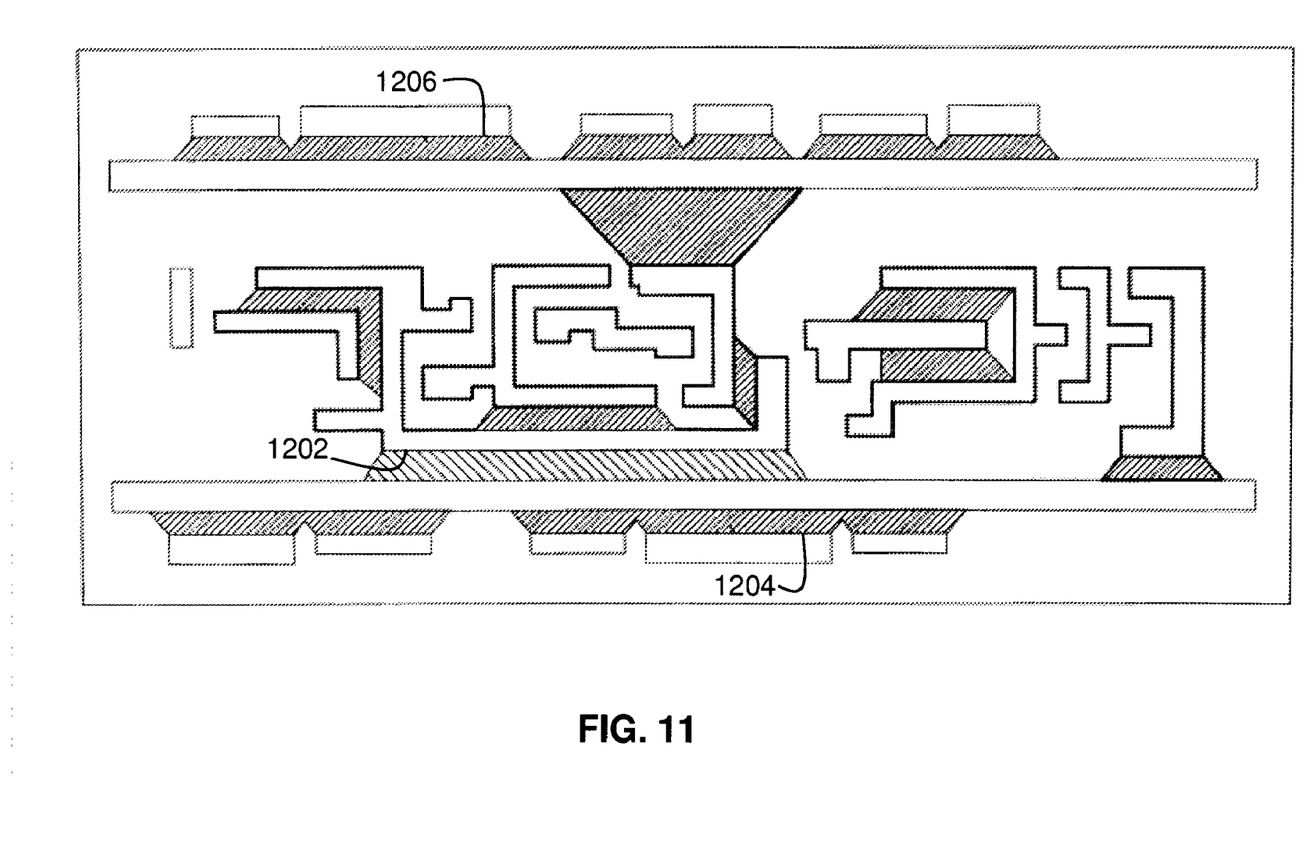
FIG. 11 is a diagram illustrating high contributing error vectors for shorts according to the teachings of the present invention.

Reference now being made to FIG. 11, a diagram is shown illustrating high contributing error vectors for shorts according to the teachings of the present invention. As previously discussed, the error vectors being displayed can be filtered according to a specified criteria and displayed using color or other means to indicate their rank or contribution to shorts.

For example, vector 1202 is indicated as being one of the most critical contributing vectors to shorts via the use of color (e.g., red) or other means. Vectors 1204 and 1206 are indicated as being the next most critical contributing vectors to shorts via the use of color (e.g., yellow) of other means.

Figure 12:
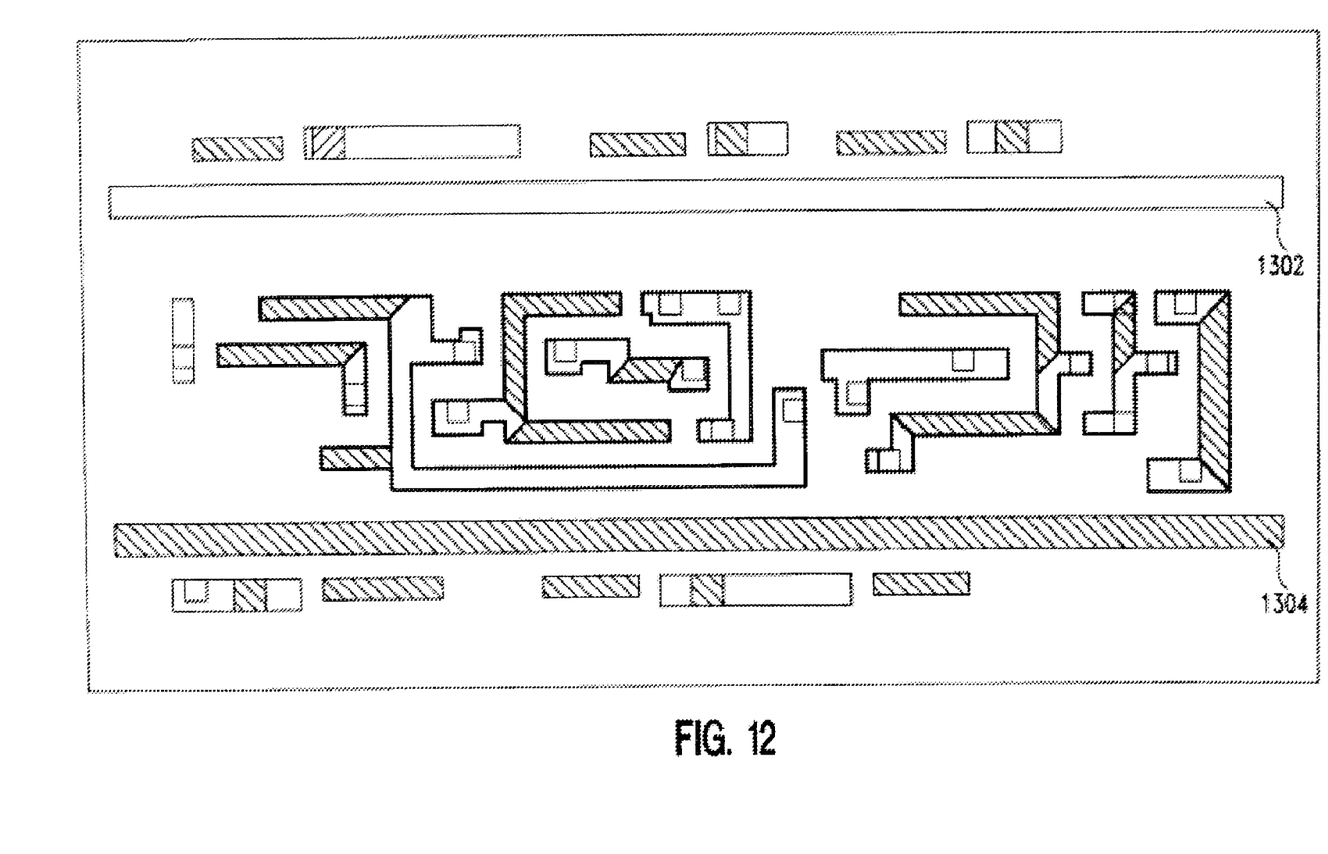
FIG. 12 is a diagram illustrating high contributing error vectors for opens according to the teachings of the present invention.

In a similar fashion, high contributing error vectors for opens can be displayed as illustrated by FIG. 12. For example, vector 1304 is indicated as being one of the most critical contributing vector to opens via the use of color (e.g., red) or other means, and vector 1302 is indicated as being the next most critical contributing vector in a similar manner.

Likewise, high contributing error vectors for vias can be displayed in a similar fashion.

Figure 13:
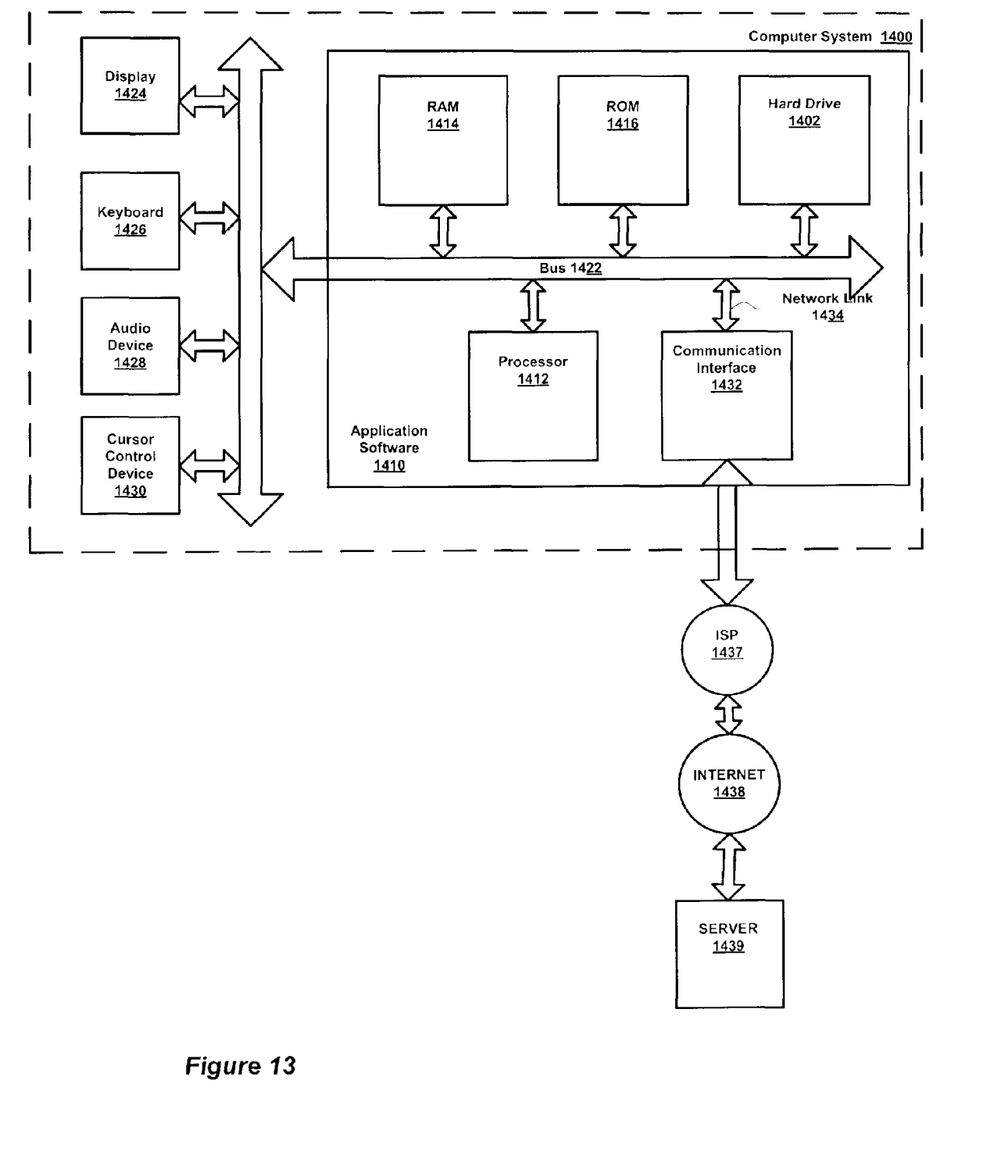
FIG. 13 is a block diagram illustrating a computer system that can perform the visual indications of the interacting edges of a design according to the teachings of the present invention.

Reference now being made to FIG. 13, a block diagram is shown illustrating a computer system 1400 that can perform the visual indications of the interacting edges of a design as described above. Computer System 1400 includes various components each of which are explained in greater detail below.

Bus 1422 represents any type of device capable of providing communication of information within Computer System 1400 (e.g., System bus, PCI bus, cross-bar switch, etc.)

Processor 1412 can be a general-purpose processor (e.g., the PowerPC™ manufactured by IBM or the Pentium™ manufactured by Intel) that, during normal operation, processes data under the control of an operating system and application software 1410 stored in a dynamic storage device such as Random Access Memory (RAM) 1414 and a static storage device such as Read Only Memory (ROM) 1416. The operating system preferably provides a graphical user interface (GUI) to the user.

The present invention, including the alternative preferred embodiments, can be provided as a computer program product, included on a machine-readable medium having stored on it machine executable instructions used to program computer system 1400 to perform a process according to the teachings of the present invention.

The term "machine-readable medium" as used in the specification includes any medium that participates in providing instructions to processor 1412 or other components of computer system 1400 for execution. Such a medium can take many forms including, but not limited to, non-volatile media, and transmission media. Common forms of non-volatile media include, for example, a floppy disk, a flexible disk, a hard disk, magnetic tape, or any other magnetic medium, a Compact Disk ROM (CD-ROM), a Digital Video Disk-ROM (DVD-ROM) or any other optical medium whether static or rewriteable (e.g., CDRW and DVD RW), punch cards or any other physical medium with patterns of holes, a programmable ROM (PROM), an erasable PROM (EPROM), electrically EPROM (EEPROM), a flash memory, any other memory chip or cartridge, or any other medium from which computer system 1400 can read and which is suitable for storing instructions. In the preferred embodiment, an example of a non-volatile medium is the Hard Drive 1402.

Volatile media includes dynamic memory such as RAM 1414. Transmission media includes coaxial cables, copper wire or fiber optics, including the wires that comprise the bus 1422. Transmission media can also take the form of acoustic or light waves, such as those generated during radio wave or infrared data communications.

Moreover, the present invention can be downloaded as a computer program product where the program instructions can be transferred from a remote computer such as server 1439 to requesting computer system 1400 by way of data signals embodied in a carrier wave or other propagation medium via network link 1434 (e.g., a modem or network connection) to a communications interface 1432 coupled to bus 1422.

Communications interface 1432 provides a two-way data communications coupling to network link 1434 that can be connected, for example, to a Local Area Network (LAN), Wide Area Network (WAN), or as shown, directly to an Internet Service Provider (ISP) 1437. In particular, network link 1434 may provide wired and/or wireless network communications to one or more networks.

ISP 1437 in turn provides data communication services through the Internet 1438 or other network. Internet 1438 may refer to the worldwide collection of networks and gateways that use a particular protocol, such as Transmission Control Protocol (TCP) and Internet Protocol (IP), to communicate with one another. ISP 1437 and Internet 1438 both use electrical, electromagnetic, or optical signals that carry digital or analog data streams. The signals through the various networks and the signals on network link 1434 and through communication interface 1432, which carry the digital or analog data to and from computer system 1400, are exemplary forms of carrier waves transporting the information.

In addition, multiple peripheral components can be added to computer system 1400. For example, audio device 1428 is attached to bus 1422 for controlling audio output. A display 1424 is also attached to bus 1422 for providing visual, tactile or other graphical representation formats. Display 1424 can include both non-transparent surfaces, such as monitors, and transparent surfaces, such as headset sunglasses or vehicle windshield displays.

A keyboard 1426 and cursor control device 1430, such as mouse, trackball, or cursor direction keys, are coupled to bus 1422 as interfaces for user inputs to computer system 1400.

The execution of application software 1410 on computer system 1400 implements the method for visually identifying the edges of a design as explained above in connection with FIGS. 7-13. It should be noted and understood by those of ordinary skill in the art, however, that the present invention is not limited to the above implementation and is independent of any computer/system architecture. Accordingly, the present invention may equally be implemented on other computing platforms, programming languages and operating systems, and also may be hardwired into a circuit or other computational component.

It is thus believed that the operation and construction of the present invention will be apparent from the foregoing description. While the method and system shown and described has been characterized as being preferred, it will be readily apparent that various changes and/or modifications could be made without departing from the spirit and scope of the present invention as defined in the following claims.

What is claimed is:

1. A method, performed on a computer system, of designing integrated circuits, comprising:
   using the computer system to perform the following:
   creating a Voronoi diagram to represent a critical area of a design of an integrated circuit, the Voronoi diagram having one or more bisectors each of which represents an interaction between two or more corresponding edges of the design; and
   visually identifying a portion of each of the two or more corresponding edges and indicating each interaction between the identified portions.

2. The method of claim 1 wherein the step of visually identifying includes a step of:
   assigning each one of the one or more bisectors so as to represent the interaction between two or more corresponding edges of the design.

3. The method of claim 2 wherein the step of visually identifying includes a step of:
   creating an identifiable region for each one of the one or more bisectors that defines the portion(s) of the edges of the design that interact with one another.

4. The method of claim 3 wherein the step of visually identifying includes a step of:
   visually identifying the portion(s) of the interacting edges that touch the identifiable region.

5. The method of claim 4 wherein the step of visually identifying includes a step of:
   creating a vector between the two or more interacting edges.

6. The method of claim 5 wherein the step of creating a vector includes a step of:
   displaying the vector in a color that represents level of importance of the interacting edges according to a predetermined criteria.

7. The method of claim 6 wherein the predetermined criteria includes a predetermined effect on an associated critical area related to the interacting edges.

8. The method of claim 7 wherein the predetermined effect on the associated critical area correlates to a magnitude of the associated critical area.

9. The method of claim 5 wherein the step of visually identifying includes a step of:
   filtering the vector based on a predetermined criteria.

10. The method of claim 9 wherein the predetermined criteria includes vectors associated with edge interactions which have been previously designated to be filtered.

11. The method of claim 10 wherein the designation of the edge interactions includes a step of:
    creating polygonal markers to designate location vectors to be filtered.

12. The method of claim 6 wherein the predetermined criteria is a critical area value assigned to the interacting edges based on a relative critical area contribution of their associated bisector with respect to a critical area of one or more adjacent Voronoi regions that are adjacent to the bisector.

13. The method of claim 12 wherein the critical area value is the critical area of the adjacent Voronoi regions multiplied by a percentage of critical area that is contributed by the associated bisector with respect to a sum of the relative critical area contributions of all bisectors representing edge interactions bordering the one or more adjacent Voronoi regions.

14. The method of claim 13 wherein the identifiable region has a polygonal shape.

15. An apparatus for designing integrated circuits, the apparatus comprising:
    means for creating a Voronoi diagram to represent a critical area of a design of an integrated circuit, the Voronoi diagram having one or more bisectors each of which represents an interaction between two or more corresponding edges of the design; and
    means for visually identifying a portion of each of the two or more corresponding edges and indicating each interaction between the identified portions.

16. The apparatus of claim 15 wherein the means for visually identifying includes:
    means for assigning each one of the one or more bisectors so as to represent the interaction between two or more corresponding edges of the design.

17. The apparatus of claim 16 wherein the means for visually identifying includes:
    means for creating an identifiable region for each one of the one or more bisectors that defines the portion(s) of the edges of the design that interact with one another.

18. The apparatus of claim 17 wherein the means for visually identifying includes:
    means for visually identifying the portion(s) of the interacting edges that touch the identifiable region.

19. The apparatus of claim 18 wherein the means for visually identifying includes:
    means for creating a vector between the two or more interacting edges.

20. The apparatus of claim 19 wherein the means for creating a vector includes:
    means for displaying the vector in a color that represents a level of importance of the interacting edges according to a predetermined criteria.

21. The apparatus of claim 20 wherein the predetermined criteria includes a predetermined effect on an associated critical area related to the interacting edges.

22. The apparatus of claim 21 wherein the predetermined effect on the associated critical area correlates to a magnitude of the associated critical area.

23. The apparatus of claim 19 wherein the means for visually identifying includes:
    means for filtering the vector based on a predetermined criteria.

24. The apparatus of claim 23 wherein the predetermined criteria includes vectors associated with edge interactions which have been previously designated to be filtered.

25. The apparatus of claim 24 wherein the designation of the edge interactions includes:
   mans for creating polygonal markers to designate location vectors to be filtered.

26. The apparatus of claim 20 wherein the predetermined criteria is a critical area value assigned to the interacting edges based on a relative critical area contribution of their associated bisector with respect to a critical area of one or more adjacent Voronoi regions that are adjacent to the bisector.

27. The apparatus of claim 26 wherein the critical area value is the critical area of the adjacent Voronoi regions multiplied by a percentage of critical area that is contributed by the associated bisector with respect to a sum of the relative critical area contributions of all bisectors representing edge interactions bordering the one or more adjacent Voronoi regions.

28. The apparatus of claim 27 wherein the identifiable region has a polygonal shape.

29. A computer program product comprising a computer usable medium having computer usable program codes which are executed on a computer for use in designing integrated circuits, the computer usable program codes comprising:
   computer usable program code for creating a Voronoi diagram to represent a critical area of a design of an integrated circuit, the Voronoi diagram having one or more bisectors each of which represents an interaction between two or more corresponding edges of the design; and
   computer usable program code for visually identifying a portion of each of the two or more corresponding edges and indicating each interaction between the identified portions.

30. The computer program product of claim 29 wherein the computer usable program code for visually identifying includes:
   computer usable program code for assigning each one of the one or more bisectors so as to represent the interaction between one or more corresponding edges of the design.

31. The computer program product of claim 30 wherein the computer usable program code for visually identifying includes:
   computer usable program code for creating an identifiable region for each one of the one or more bisectors that defines the portion(s) of the edges of the design that interact with one another.

32. The computer program product of claim 31 wherein the computer usable program code for visually identifying includes:
   computer usable program code for visually identifying the portion(s) of the interacting edges that touch the identifiable region.

* * * * *